(12) United States Patent
Wan et al.

(10) Patent No.: US 11,271,035 B2
(45) Date of Patent: Mar. 8, 2022

(54) SPIN-ORBIT-TORQUE MAGNETORESISTIVE MEMORY CELL WITH INTEGRATED SELECTOR ELEMENTS AND METHOD OF MAKING THE SAME

(71) Applicant: Western Digital Technologies, Inc., San Jose, CA (US)

(72) Inventors: Lei Wan, San Jose, CA (US); Jordan Katine, Mountain View, CA (US); Neil Robertson, Palo Alto, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 82 days.

(21) Appl. No.: 16/401,172

(22) Filed: May 2, 2019

(65) Prior Publication Data

US 2020/0350364 A1    Nov. 5, 2020

(51) Int. Cl.
| | |
|---|---|
| *H01L 27/22* | (2006.01) |
| *H01L 43/02* | (2006.01) |
| *G11C 11/16* | (2006.01) |
| *H01L 43/12* | (2006.01) |
| *H01L 43/08* | (2006.01) |

(52) U.S. Cl.
CPC ......... *H01L 27/224* (2013.01); *G11C 11/161* (2013.01); *G11C 11/1659* (2013.01); *H01L 27/228* (2013.01); *H01L 43/02* (2013.01); *H01L 43/12* (2013.01); *G11C 11/1655* (2013.01);

(Continued)

(58) Field of Classification Search
CPC ..... H01L 27/224; H01L 27/228; H01L 43/02; H01L 43/12; H01L 43/08; G11C 11/161; G11C 11/1659; G11C 11/1655; G11C 11/1657; G11C 11/1673
See application file for complete search history.

(56) References Cited

U.S. PATENT DOCUMENTS

| | | | |
|---|---|---|---|
| 7,474,723 | B2 | 1/2009 | Oyama |
| 9,252,362 | B2 | 2/2016 | Pio |

(Continued)

FOREIGN PATENT DOCUMENTS

| | | |
|---|---|---|
| WO | WO2019005162 A1 | 1/2019 |
| WO | WO2019005172 A1 | 1/2019 |

OTHER PUBLICATIONS

Notification of Transmittal of the International Search Report and Written Opinion of the International Search Authority for International Patent Application No. PCT/US2019/068899, dated Apr. 26, 2020, 12 pages.

(Continued)

*Primary Examiner* — Peter Bradford
(74) *Attorney, Agent, or Firm* — The Marbury Law Group PLLC

(57) ABSTRACT

A spin-orbit-torque (SOT) magnetoresistive random access memory (MRAM) device includes a SOT MRAM cell containing a first two terminal selector element, a nonmagnetic metallic assist plate, and a magnetic tunnel junction located between the first two terminal selector element and the nonmagnetic metallic assist plate, and a circuit selection element selected from a transistor or a second two terminal selector element electrically connected to the nonmagnetic metallic assist plate of the SOT MRAM cell.

2 Claims, 10 Drawing Sheets

(52) U.S. Cl.
CPC ....... *G11C 11/1657* (2013.01); *G11C 11/1673* (2013.01); *H01L 43/08* (2013.01)

(56) References Cited

U.S. PATENT DOCUMENTS

| | | | |
|---|---|---|---|
| 9,542,987 | B2 | 1/2017 | Naik et al. |
| 9,768,229 | B2 | 9/2017 | Braganca et al. |
| 9,830,966 | B2 | 11/2017 | Mihajlovic et al. |
| 10,229,723 | B1 | 3/2019 | Choi et al. |
| 2005/0220150 | A1 | 10/2005 | Oyama |
| 2016/0225423 | A1 | 8/2016 | Naik et al. |
| 2017/0117027 | A1 | 4/2017 | Braganca et al. |
| 2017/0117323 | A1 | 4/2017 | Braganca et al. |
| 2017/0125078 | A1 | 5/2017 | Mihjlovic et al. |
| 2019/0027201 | A1 | 1/2019 | Petti et al. |
| 2019/0080738 | A1 | 3/2019 | Choi et al. |
| 2019/0172998 | A1* | 6/2019 | Tan .................. H01L 43/08 |
| 2019/0206939 | A1* | 7/2019 | Bozdag .............. G11C 11/00 |
| 2019/0334080 | A1* | 10/2019 | Ahmed ............. G11C 11/1653 |
| 2020/0135804 | A1* | 4/2020 | Luo .................. G11C 11/1675 |
| 2020/0185015 | A1* | 6/2020 | Le .................... H01L 43/08 |

OTHER PUBLICATIONS

U.S. Appl. No. 16/024,490, filed Jun. 29, 2018, SanDisk Technologies LLC.
U.S. Appl. No. 16/024,521, filed Jun. 29, 2018, SanDisk Technologies LLC.
U.S. Appl. No. 16/212,132, filed Dec. 6, 2018, SanDisk Technologies LLC.
U.S. Appl. No. 16/212,257, filed Dec. 6, 2018, SanDisk Technologies LLC.
U.S. Appl. No. 16/212,342, filed Dec. 6, 2018, SanDisk Technologies LLC.
U.S. Appl. No. 16/212,420, filed Dec. 6, 2018, SanDisk Technologies LLC.
U.S. Appl. No. 16/250,403, filed Jan. 17, 2019, SanDisk Technologies LLC.
Kim, Y. et al. "Multilevel Spin-Orbit Torque MRAMs," IEEE Transactions on Electron Devices, vol. 62, No. 2, pp. 561-568, (2015).

* cited by examiner

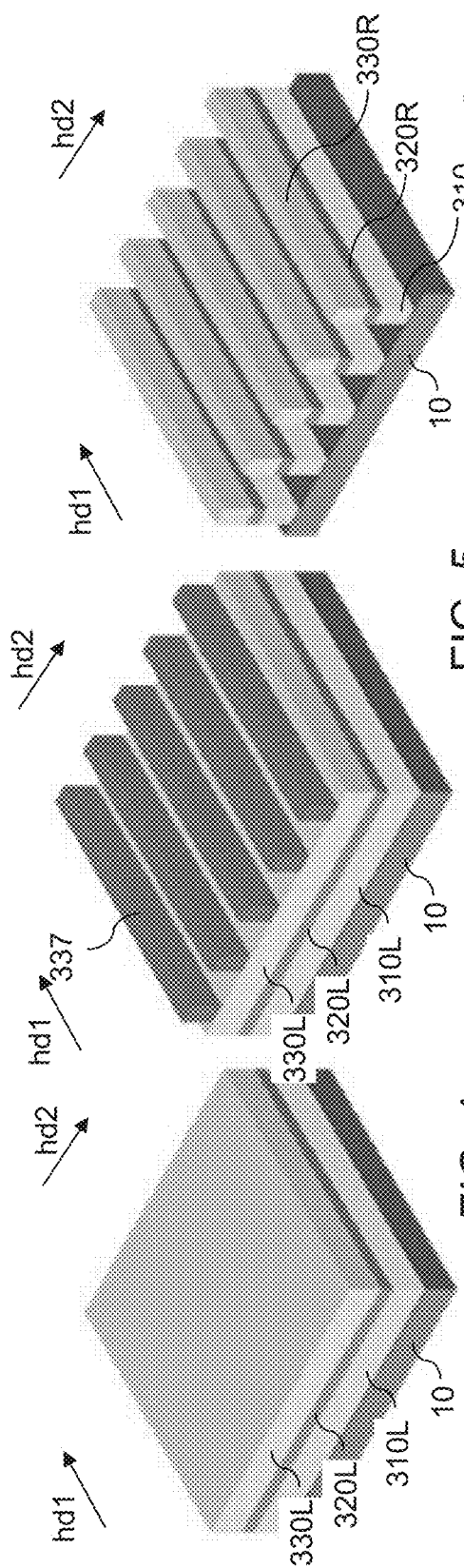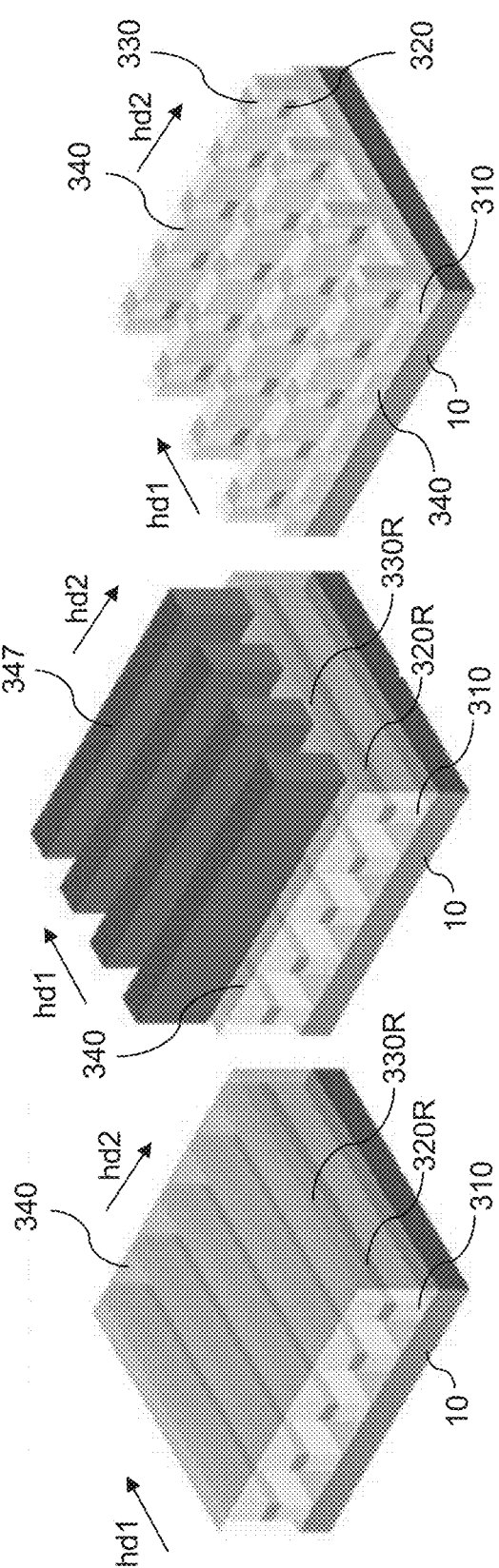
FIG. 4
FIG. 5
FIG. 6
FIG. 7
FIG. 8
FIG. 9

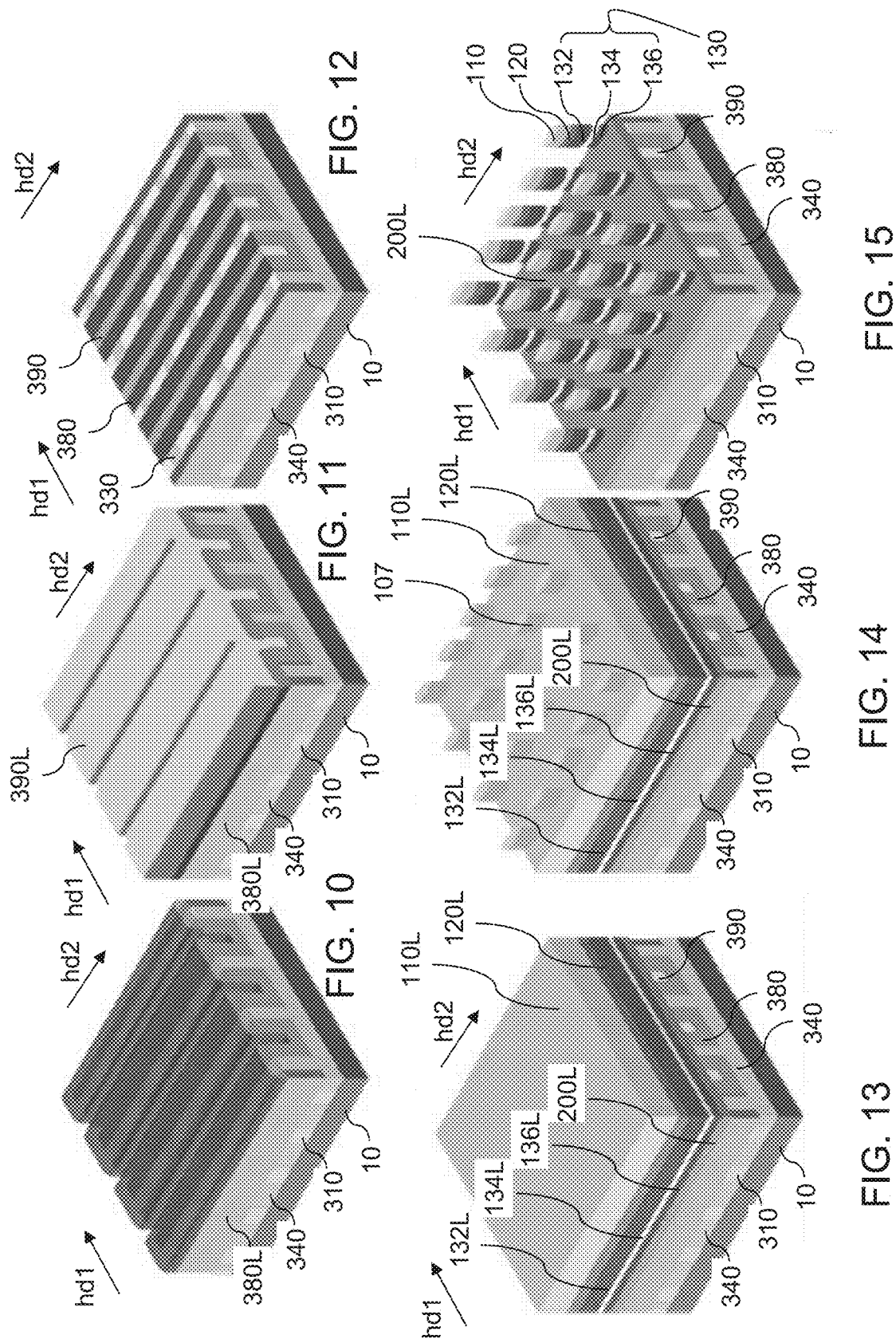

SPIN-ORBIT-TORQUE MAGNETORESISTIVE MEMORY CELL WITH INTEGRATED SELECTOR ELEMENTS AND METHOD OF MAKING THE SAME

FIELD

The present disclosure relates generally to the field of magnetic memory devices, and particular to a spin-orbit-torque magnetoresistive memory cell with an integrated selector element and methods of manufacturing the same.

BACKGROUND

Spin-orbit-torque (SOT) magnetoresistive random access memory (MRAM) devices (also known as magnetic random access memory devices) use switching of magnetization direction of a free magnetic layer by injection of an in-plane current in an adjacent conductive layer, which is referred to as a spin-orbit-torque (SOT) layer. Unlike spin-torque-transfer (STT) magnetoresistive random access memory (MRAM) devices in which the electrical current is injected along a direction perpendicular into a magnetic tunnel junction, the write operation is performed by flowing an electrical current through the SOT layer. The read operation of a SOT memory cell is performed by passing electrical current through the magnetic tunnel junction of the SOT memory cell.

SUMMARY

According to an aspect of the present disclosure, a spin-orbit-torque (SOT) magnetoresistive random access memory (MRAM) device includes a SOT MRAM cell containing a first two terminal selector element, a nonmagnetic metallic assist plate, and a magnetic tunnel junction located between the first two terminal selector element and the nonmagnetic metallic assist plate, and a circuit selection element selected from a transistor or a second two terminal selector element electrically connected to the nonmagnetic metallic assist plate of the SOT MRAM cell.

According to another aspect of the present disclosure a method of forming a magnetoresistive memory device includes forming first access lines over a substrate, forming a two-dimensional array of circuit selection elements electrically connected to the first access lines, forming a two-dimensional array of discrete nonmagnetic metallic assist plates such that a first end portion of each of the discrete nonmagnetic metallic assist plates is electrically connected to a respective circuit selection element of the two-dimensional circuit selection elements, forming a two-dimensional array of vertical stacks on the two-dimensional array of discrete nonmagnetic metallic assist plates, wherein each of the vertical stacks comprises from top to bottom, a first selector element, a magnetic reference layer, a tunneling dielectric layer and a magnetic free layer, and forming read lines over the two-dimensional array of vertical stacks, wherein each of the read lines is electrically connected to upper ends of a respective subset of the first selector elements.

BRIEF DESCRIPTION OF THE DRAWINGS

FIGS. 4-12 are perspective views illustrating a sequence of processing steps that can be employed to form the second exemplary SOT magnetoresistive memory array of the present disclosure.

FIGS. 13-21 are perspective views illustrating a sequence of processing steps that can be employed to form the first exemplary SOT magnetoresistive memory array or the second exemplary SOT magnetoresistive memory array of the present disclosure.

DETAILED DESCRIPTION

Figure 1A:
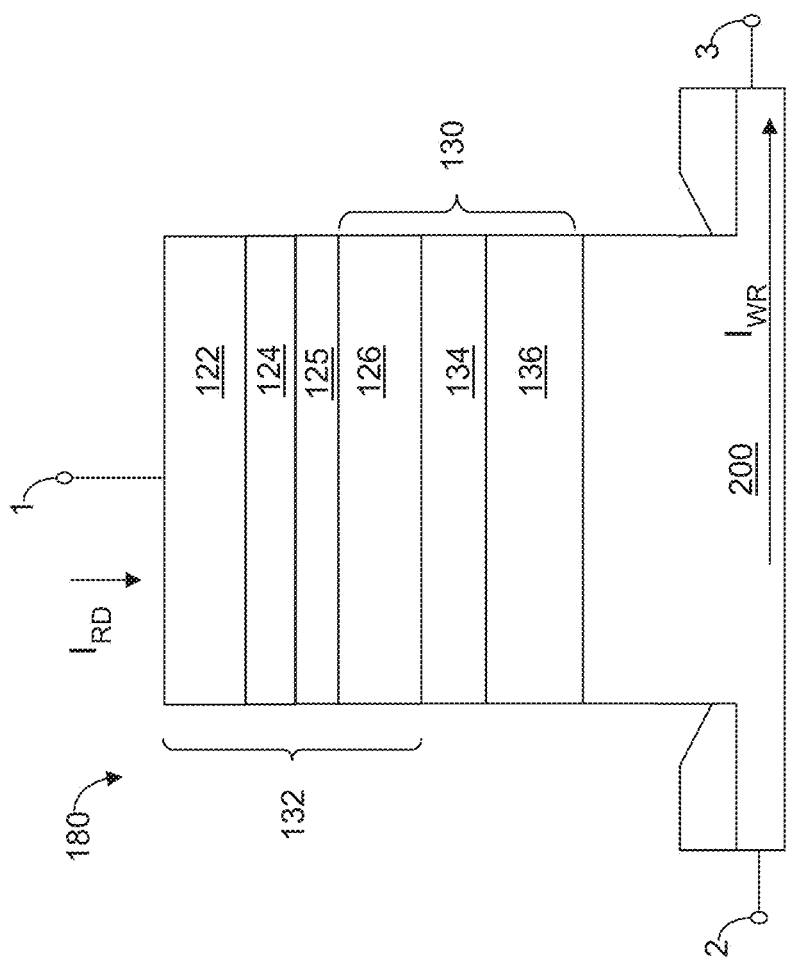
FIG. 1A is a schematic side-cross sectional view of a spin-orbit-torque magnetoresistive random access memory cell.

As discussed above, the present disclosure is directed to a spin-orbit-torque magnetoresistive memory cell with an integrated selector element and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "metallic material" refers to a conductive material including at least one metallic element therein. All measurements for electrical conductivities are made at the standard condition.

Magnetization switching via spin-orbit torque (SOT) is a promising alternative to direct spin-transfer torque (STT) for writing bits in magnetoresistive random access memory (MRAM) cells. A typical SOT MRAM cell 180 shown in FIG. 1A includes a nonmagnetic heavy metal SOT layer 200 with strong spin-orbit coupling with, and in contact with, a magnetic layer, which is a free layer 136 that can switch magnetization directions. When an electric write current laterally passes through the SOT layer 200, spin current is generated in a direction perpendicular to the electrical current via the spin Hall effect (SHE). The spin current exerts a torque on the magnetization of the magnetic layer, i.e., the free layer 136. Thus, the SOT layer 200 assists in the transition of the magnetization direction in the free layer 136 through the spin Hall effect. Thus, the SOT layer 200 is also referred to as metallic assist layer, i.e., a metallic layer that assists the magnetic transition in the free layer 136. Since very little electrical current flows through the magnetic tunnel junction 130 including the free layer 136, the SOT MRAM cells 180 exhibit higher endurance with lower write error rate than STT MRAM cells. In addition, SOT MRAM cells 180 require lower write-energy than STT MRAM cells. Finally, SOT switching can achieve nanosecond, and even sub-ns writing speeds.

In one embodiment, the reference layer 126 may be a component layer within a synthetic antiferromagnetic structure (SAF structure) 132. The SAF structure 132 can include a fixed ferromagnetic layer 122 having a fixed magnetization, the reference layer 126 having a magnetization that is antiparallel to the fixed vertical magnetization of the fixed ferromagnetic layer 122, and an antiferromagnetic (AFM) coupling layer 124 located between, and providing an antiferromagnetic coupling between, the fixed ferromagnetic layer 122 and the reference layer 126.

The reference layer 126 may comprise one of Ni, Fe, Co, B, Ge, Mn, and/or alloys of Ni, Fe, B, Ge, Mn, and/or combinations and mixtures thereof, such as NiFe, CoFe, or CoFeB, and/or Co/Pt, Co/Pd, or Co/Ni superlattices. The magnetic moment of the reference layer 126 may be in the plane of the layer or perpendicular to the plane of the layer.

The barrier layer 134 may be made of a nonmagnetic metal such as Cu or Ag, or an insulating material such as alumina, MgO, or HfO. The free layer 136 may comprise one of Ni, Fe, Co, B, Ge, Mn, and/or alloys of Ni, Fe, B, Ge, Mn, and/or combinations and mixtures thereof, such as NiFe, CoFe, or CoFeB. The magnetic moment of the free layer 136 may be in the plane of the layer or perpendicular to the plane of the layer, however, it's orientation is always collinear with that of the reference layer; i.e. they are either both in-plane or both perpendicular to the plane of their layers. The SOT layer 200 may be made of a material having large spin-orbit coupling strength, such as Pt, Ta, W, Hf, Jr, CuBi, CuIr, AuPt, AuW, PtPd, PtMgO, or a topological insulator such as alpha-Sn.

The SOT MRAM cell 180 can include the magnetic tunnel junction (MTJ) 130, which is a pair of magnetic layers (126, 136) separated by a tunneling dielectric layer 134 (e.g., a MgO layer). One of the two magnetic layers known as a reference layer 126 is typically coupled to a pinning layer 122 and made magnetically stiff through a phenomenon of exchange bias. The pinning layer 122 is typically an antiferromagnetic (AFM) material layer (for example an IrMn layer) in the case of an in-plane reference layer, and is typically a Co/Pt multilayer in the case of the magnetization is perpendicular to the film plane. The reference layer 126 and the pinning layer 122 may be portions of a synthetic antiferromagnetic structure (SAF structure) 132. In a SAF structure, the layer adjacent to the pinning layer is known as the pinned layer 124. A thin coupling layer 125 (such as a ruthenium layer) is provided between the pinned layer 124 and the reference layer. The thickness of the coupling layer 125 can be selected such that the magnetization of the reference layer 126 is anti-parallel to the magnetization of the pinned layer 124. The magnetic moments of the pinned layer 124 and the reference layer 126 are typically chosen to minimize the stray fields from the SAF 132, although they can be unbalanced if some amount of stray field is desirable. The second magnetic layer known as the free layer 136 is free to switch between two known configurations, creating a memory effect where the resistance of the MTJ 130 is either high or low to represent "0" or "1".

As shown in FIG. 1A, the SOT MRAM cell 180 can have the AFM layer 122 above the top magnetic layer (which in this embodiment is the reference layer 126) to form a top-pinned type SOT MRAM cell 180. Alternatively, the positions of reference layer 126 and free layer 136 in the MTJ 130 can be reversed and the AFM layer 122 may be located below the bottom magnetic layer 126 (which in this embodiment is also the reference layer) to form a bottom-pinned SOT MRAM cell. In the bottom-pinned SOT MRAM cell, the SOT layer 200 is formed above the MTJ 130.

During sensing (i.e., reading) operation, a read current $I_{RD}$ may flow between terminal 1 (which is electrically connected to the SAF 132 and the AFM layer 122) and terminal 3 (which is electrically connected to one end of the SOT layer 200) through the tunnel junction 130. During a programming (i.e., writing) operation, a write current $I_{WR}$ between the terminal 2 and terminal 3 (which is electrically connected to the other end of the SOT layer 200). A fraction of the spin current can flow up and into (and down and out of) the nonmagnetic SOT layer 200 to induce the transition of the magnetization of the adjacent free layer 136. The write current does not flow through the tunnel junction 130 to terminal 1. Thus, the read and write currents flow in different (e.g., perpendicular) directions.

Prior art SOT MRAM cells are fabricated as a 3-terminal device that requires two transistors to control the write operation and the read operation. This results in larger bit-cell footprint, and makes it difficult to scale down the device for high areal density. In this case, two transistors are electrically connected to each SOT MRAM cell 180. A first "read" transistor is electrically connected to terminal 1, while a second "write" transistor is electrically connected to terminal 2 of the SOT MRAM 180. The two transistors take up device area and decrease the overall device density. Furthermore, the read and write transistors are connected to the top and the bottom terminals respectively, which complicates the fabrication process. In order to increase the operational speed and to reduce the write error rate, a large overdrive current is often used for prior art SOT MRAM cells. A larger transistor is used for a large drive current, which further reduces the device density. Various embodiments of the present disclosure provide a higher density SOT MRAM that includes a combination of a transistor and a selector element for each SOT MRAM cell 180, or two selector elements for each SOT MRAM cell 180, instead of two transistors for each conventional SOT MRAM cell. By reducing the number of transistors used for each SOT MRAM cell from two to one or zero, the device density is increased.

Figure 1B:
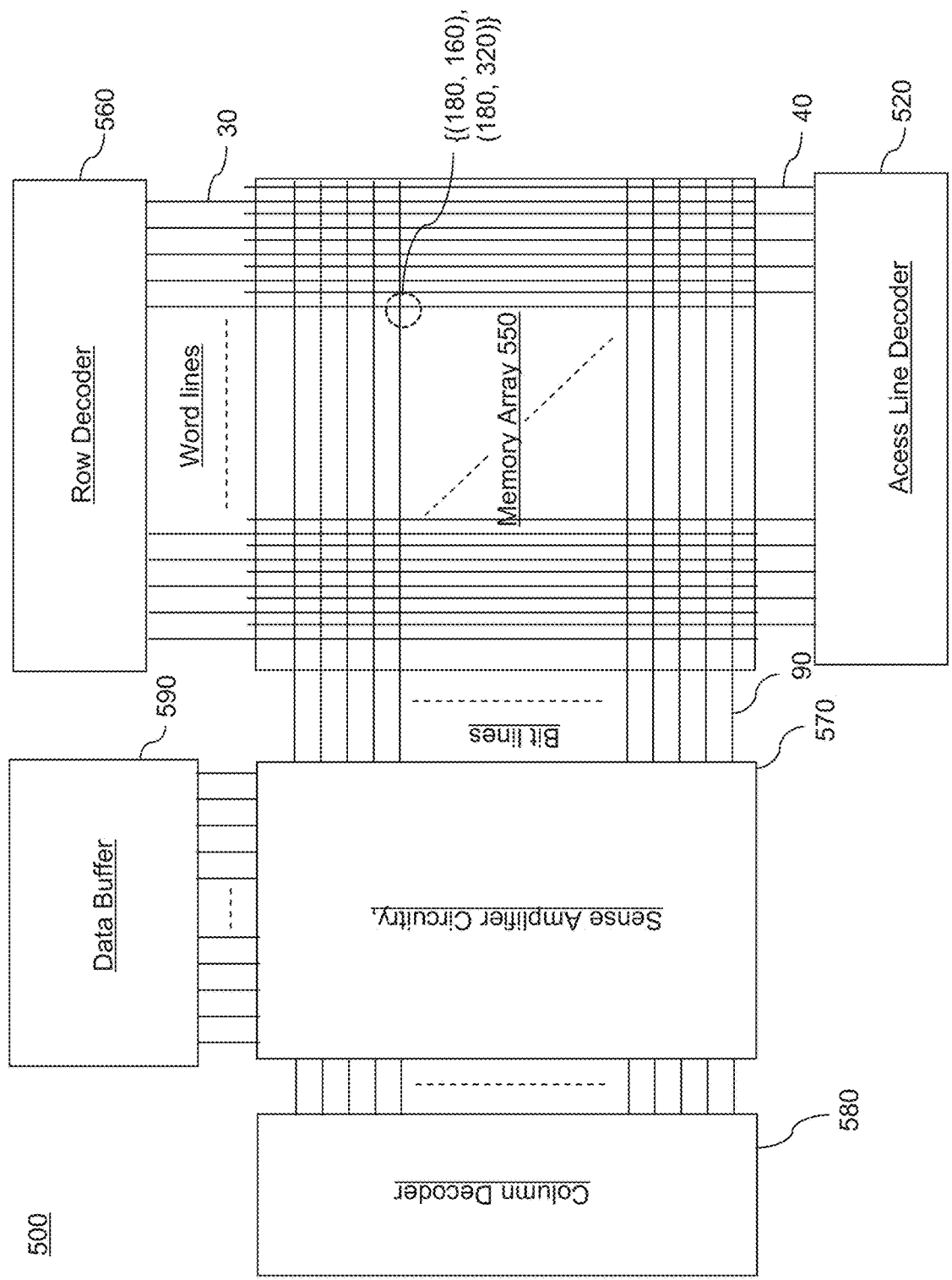
FIG. 1B is a schematic diagram of a memory array device including spin-orbit-torque magnetoresistive random access memory cells of the embodiments of the present disclosure in an array configuration.
Figure 1C:
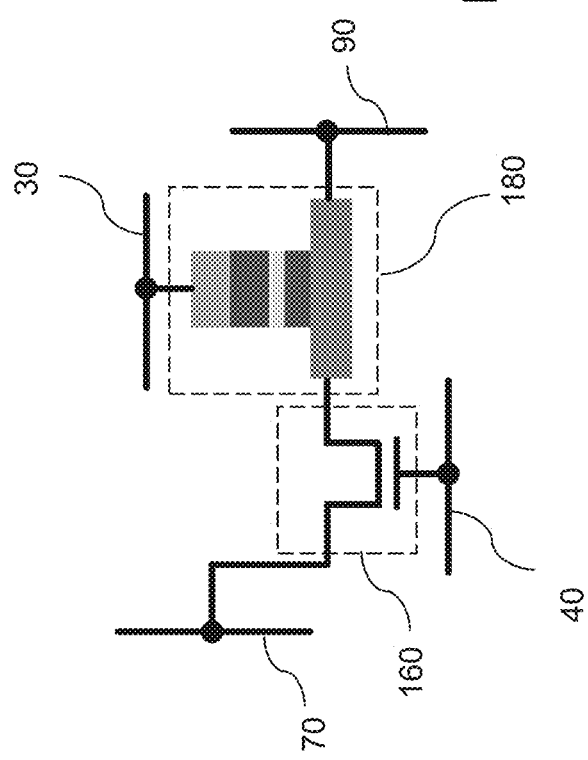
FIG. 1C is a first exemplary configuration for a unit cell of the memory array device of FIG. 1B.
Figure 1D:
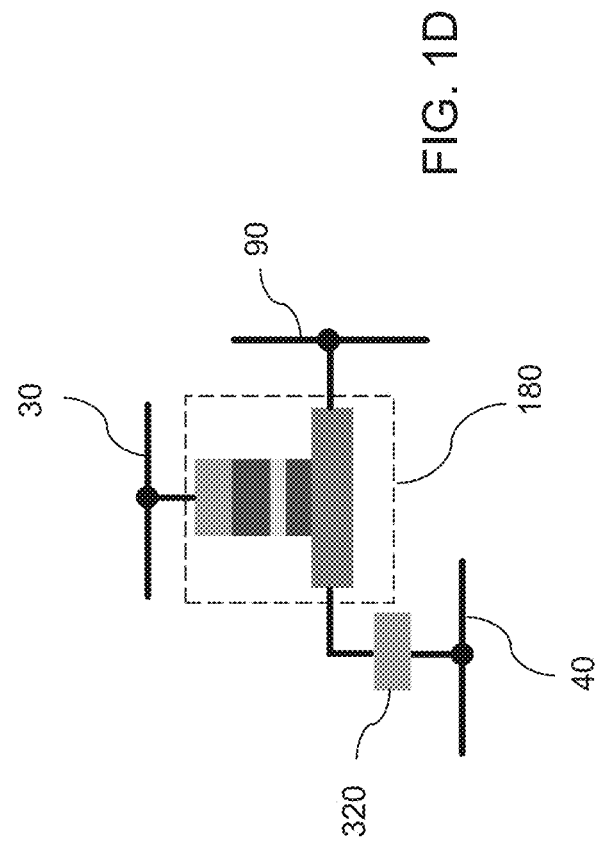
FIG. 1D is a second exemplary configuration for a unit cell of the memory array device of FIG. 1B.

Referring to FIGS. 1B-1D, a schematic diagrams is shown for spin-orbit-torque (SOT) magnetoresistive memory devices including an array of unit cells {180, (160 or 320)} of embodiments of the present disclosure in an array configuration. Each unit cell {180, (160 or 320)} includes a combination of a magnetoresistive memory cell 180 and a transistor 160, or a combination of a magnetoresistive memory cell 180 and a selector element 320. The magnetic memory device can be configured as a magnetoresistive random access memory (MRAM) device 500 containing magnetoresistive memory cells, i.e., SOT MRAM cells 180. As used herein, a "MRAM device" refers to a magnetoresistive memory device containing cells that allow random access, e.g., access to any selected memory cell upon a command for reading the contents of the selected memory cell.

The MRAM device 500 of an embodiment of the present disclosure includes a memory array region 550 containing an array of unit cells {(180, 160), (180, 320)} located at intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). Each unit cell {(180, 160), (180, 320)} can include a series connection of a SOT MRAM cell 180 and a transistor 160 as illustrated in FIG. 1C, or can include a series connection of a SOT MRAM cell 180 and a selector element 320 as illustrated in FIG. 1D. Access lines 40 are provided to each cross-point at which a word line intersects a bit line. Thus, the MRAM device 500 is in a cross-point array configuration with additional access lines 40 that access a row of transistors 160, a column of transistors 160, a row of selector elements 320, or a column of selector elements 320. A bias line 70 having a fixed voltage (such as a power supply voltage or electrical ground voltage) may be connected to a node of the unit cells {(180, 160), (180, 320)} as needed.

The MRAM device 500 contains a row decoder 560 connected to the word lines, sense circuitry 570 (e.g., a sense amplifier and other bit line control circuitry) connected to the bit lines, a column decoder 580 connected to the bit lines, and a data buffer 590 connected to the sense circuitry. In the first embodiment, the MRAM device 500 can contain an access line decoder 520 connected to access lines 40 if transistor circuit selection elements are used to write to a respective SOT MRAM cell 180. Multiple instances of the magnetoresistive memory cells 180 are arranged in an array configuration that forms the MRAM device 500. It should be noted that the location and interconnection of elements are schematic, and the elements may be arranged in a different configuration. Further, the SOT MRAM cell 180 of the embodiments of the present disclosure may be manufactured as a discrete device, i.e., a single isolated device.

Figure 2A:
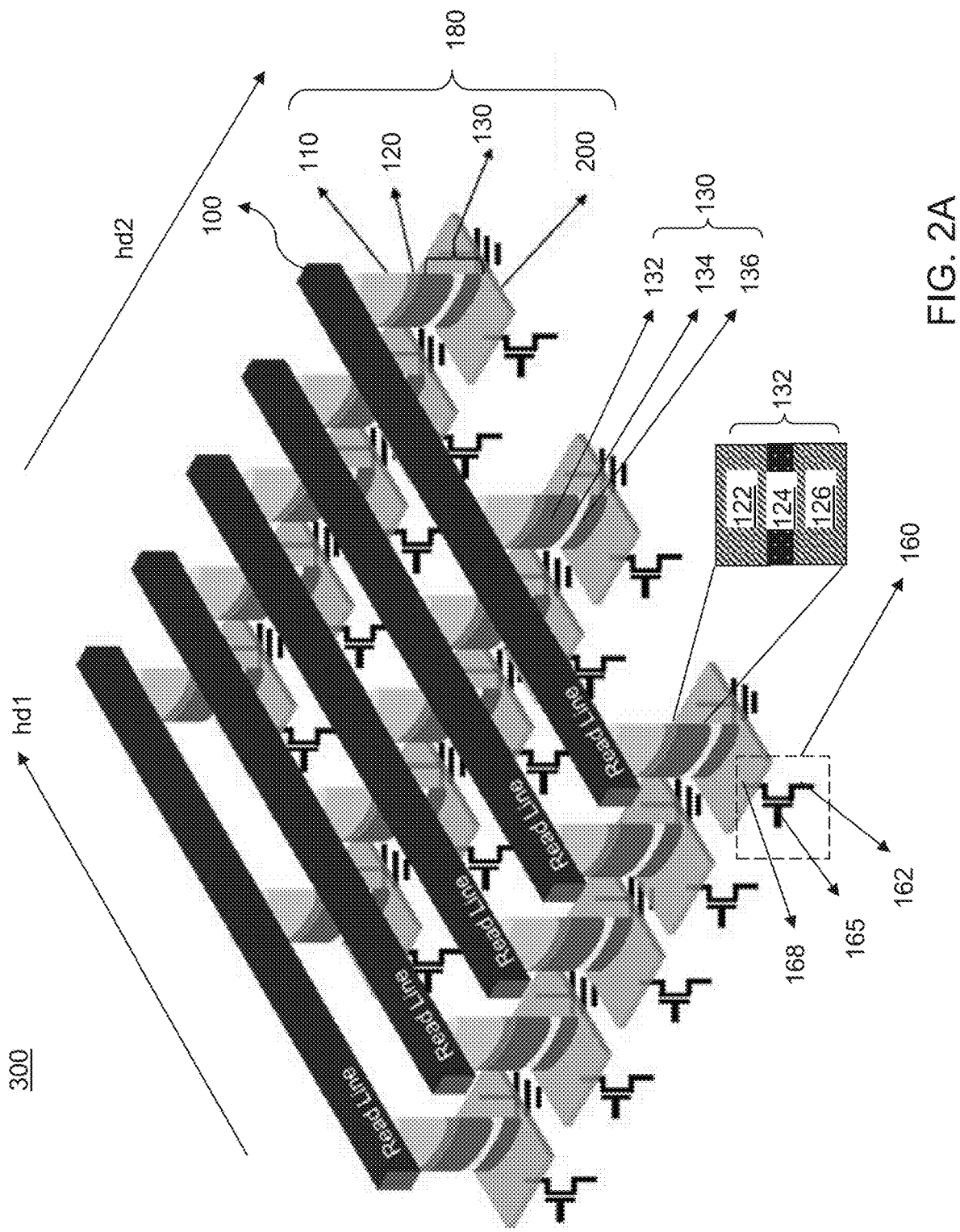
FIG. 2A illustrates a perspective view of an array region of a first exemplary spin-orbit-torque (SOT) magnetoresistive memory array of the present disclosure.
Figure 2B:
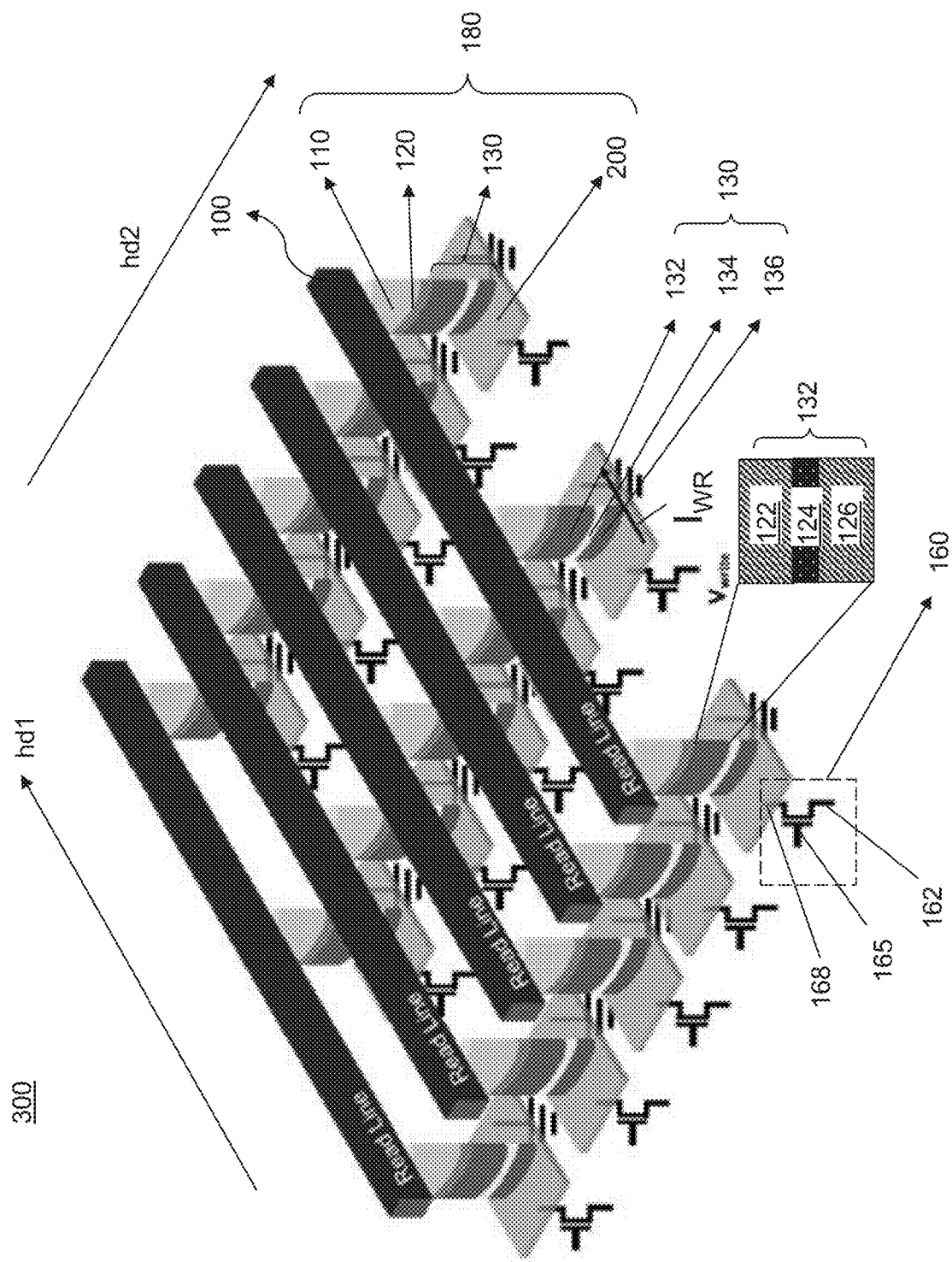
FIG. 2B illustrates electrical current flow during a write operation of the first exemplary SOT magnetoresistive memory array of the present disclosure.
Figure 2C:
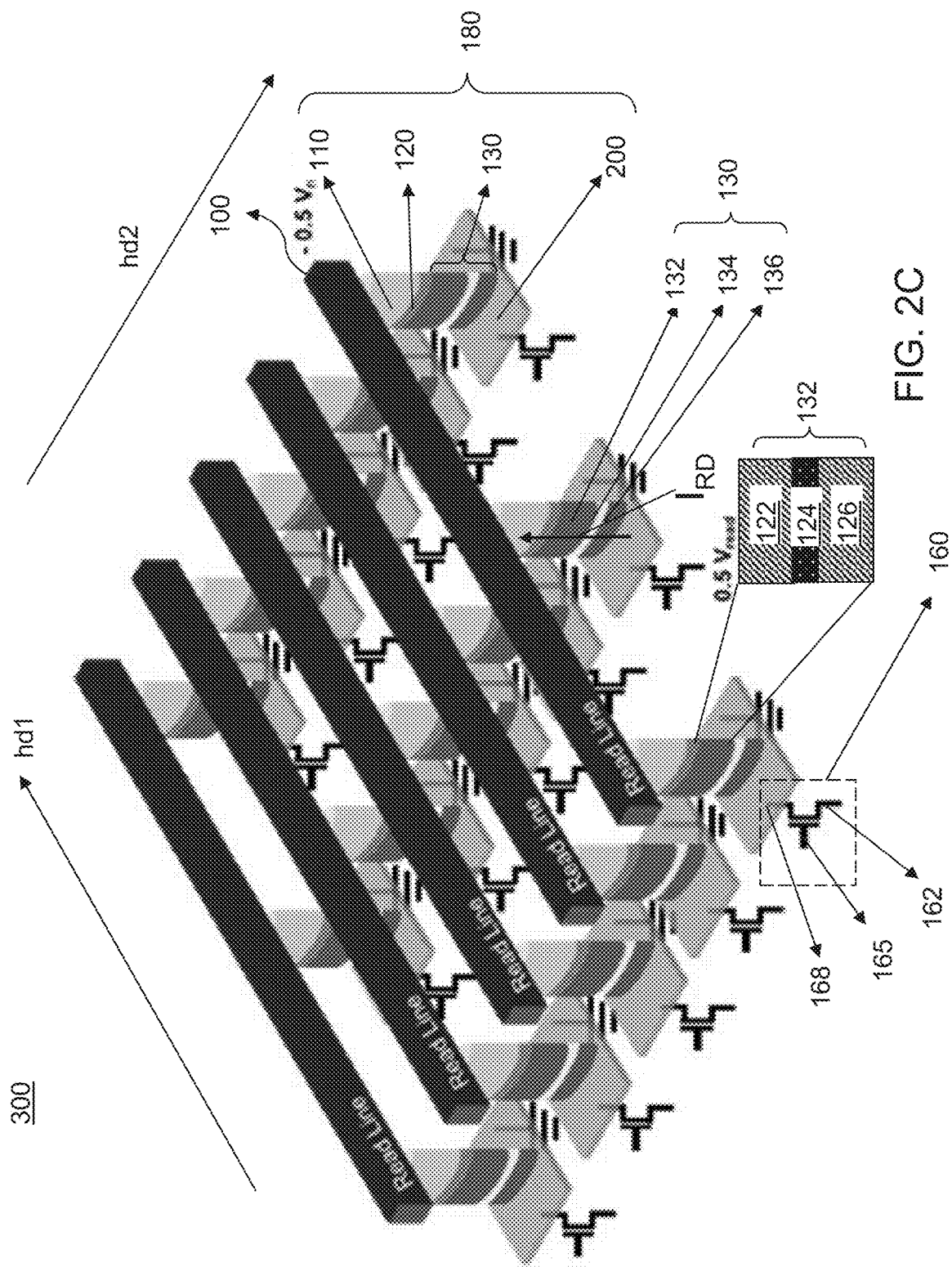
FIG. 2C illustrates electrical current flow during a read operation of the first exemplary SOT magnetoresistive memory array of the present disclosure.

Referring to FIGS. 2A-2C, an array region of a first exemplary spin-orbit-torque (SOT) magnetoresistive memory array 300 of the first embodiment of the present disclosure is illustrated. The first exemplary SOT magnetoresistive memory array is magnetoresistive memory device that includes a two-dimensional array of spin-orbit-torque (SOT) MRAM cells 180 in a top-pinned configuration. It should be understood that the array 300 may be turned up-side down to form the SOT MRAM cells 180 in a bottom-pinned configuration. Each of the SOT MRAM cells 180 comprises a vertical stack including, from top to bottom, an optional metallic capping material portion 110, a first selector element 120, a magnetic junction 130 and a SOT layer 200. The first selector elements 120 are also referred to as upper selector elements in this embodiment. Each magnetic junction 130 includes a magnetic reference layer 126 having a fixed magnetization direction, a nonmagnetic barrier layer 134, such as a tunneling dielectric layer, and a magnetic free layer 136 configured to have a magnetization direction that is parallel or antiparallel to the fixed magnetization direction of the reference layer 126. The magnetic junction 130 may be a magnetic tunnel junction. In one embodiment, the first exemplary SOT magnetoresistive memory array 300 may be a rectangular periodic array.

The metallic capping material portions 110 can include a metallic material such as Ta, TiN, TaN, carbon, and/or WN. The magnetic junction 130 can include any magnetic junction suitable for providing a SOT MRAM cell 180, such as CoFe or CoFeB magnetic reference and free layers (126, 136) separated by a tunneling dielectric layer, such as an MgO layer 134.

The first selector elements 120 can include any suitable two terminal selector element, such as a first diode threshold switch material (e.g., materials for p-n semiconductor diode, p-i-n semiconductor diode, Schottky diode or metal-insulator-metal diode) or a first ovonic threshold switch material. The ovonic threshold switch material is a material that behaves as a conductor above a critical electrical field thereacross and behaves as an insulator below the critical electrical field thereacross. In one embodiment, the first ovonic threshold switch material can be a chalcogenide compound, such as a telluride compound, a selenide compound, a selenide-telluride compound, or a sulfide-selenide-telluride compound. Exemplary ovonic switch materials include, but are not limited to zinc telluride compounds (such as $Zn_{1-x}Te_x$), germanium telluride compounds, germanium selenide compounds doped with a dopant selected from As, N, and C, such as a Ge—Se—As. In one embodiment, the ovonic threshold switch material layer can include, and/or can consist essentially of, a GeSeAs alloy, a ZnTe alloy, a GeSe alloy, a SeAs alloy, a GeTe alloy, or a SiTe alloy.

The first exemplary spin-orbit-torque (SOT) magnetoresistive memory array 300 includes a two-dimensional array of discrete nonmagnetic metallic assist plates (i.e., SOT layers) 200 for the respective SOT MRAM cells 180. The discrete metallic assist plates (i.e., SOT layers) 200 configured to provide rotating spin transfer torque to a respective free layer 136 to assist switching of the magnetization direction of the respective free layer 136 during programming. The discrete metallic assist plates 200 can comprise, and/or consist essentially of, at least one heavy elemental metal to maximize spin transfer across the interface between the free layer 136 and the discrete metallic assist plates 200. In one embodiment, the elemental metal can have an atomic number in a range from, and including, 72 to, and including, 79. For example, the at least one elemental metal can include one or more of Hf, Ta, W, Re, Os, Ir, Pt, and Au. In one embodiment, the discrete metallic assist plates 200 can comprise, and/or consist essentially of, tungsten. In other words, in an embodiment, the discrete metallic assist plates 200 is made of an elemental metal which is undoped and unalloyed other than unavoidable impurities that are introduced during manufacturing at trace levels. In one embodiment, the discrete metallic assist plates 200 can have a respective rectangular shape, and may be elongated along the first horizontal direction hd1, which in one embodiment can be parallel to the direction of the bit lines 90 in FIG. 1B.

In one embodiment, each of the discrete metallic assist plates 200 contacts a bottom surface of a respective one of the free layers 136. In one embodiment, each SOT MRAM cell 180 contains one respective, discrete metallic assist plate (i.e., SOT layer) 200. In this embodiment, the two-dimensional array of discrete metallic assist plates 200 and the two-dimensional array 300 of SOT MRAM cells 180 have a same two-dimensional periodicity. In one embodiment, each of the two-dimensional array of discrete metallic assist plates 200 and the two-dimensional array 300 of SOT MRAM cells 180 can be a rectangular periodic array having a first pitch along the first horizontal direction hd1 and a second pitch along the second horizontal direction hd2 (which in one embodiment may be parallel to the direction of the word lines 30 in FIG. 1B). In one embodiment, each free layer 136 can contact a center portion of a top surface of a respective one of the discrete metallic assist plates 200.

In the embodiment of FIGS. 2A-2C, read lines 100 are provided over the two-dimensional array of SOT MRAM cells 180. In one embodiment, the read lines 100 may comprise the bit lines 90 illustrated in FIG. 1B or may be electrically connected to the bit lines 90. In other device configurations, the read line 100 may the word lines 30 illustrated in FIG. 1B or may be electrically connected to the word lines 30 if the word lines are instead connected to read circuitry.

The read lines 100 can be metal lines that laterally extend along the first horizontal direction hd1, and are laterally spaced apart along the second horizontal direction hd2. In this embodiment, the read lines 100 are electrically connected to upper ends of a respective subset of the first selector elements located within a respective row of the SOT MRAM cells 180. The metallic capping material portion 110, if present, contacts the first selector element 120 and contacts a bottom surface of a respective one of the read lines 100. A row of the SOT MRAM cells 180 can be activated by each read line 100.

One circuit selection element can be provided per SOT MRAM cell 180. The circuit selection element may be selected from a transistor and a second two terminal selector element. First access lines and second access lines laterally extending along mutually perpendicular directions can be provided. The first access lines and the second access lines can be the word lines 30 and the access lines 40 illustrated in FIG. 1B. In one embodiment, the first access lines can be the word lines 30 and the second access lines can be the access lines 40. Alternatively, the first access lines can be the access lines 40 and the second access lines can be the word lines 30. Generally, the first access lines and the second access lines can be configured to activate electrical current flow through a selected one of the discrete metallic assist plates 200 by activating a respective transistor circuit selection element.

Referring back to FIGS. 1B and 2A-2C, in one embodiment, the circuit selection elements can include transistors 160. One transistor 160 can be provided per SOT MRAM cell 180. Each transistor 160 can include a gate electrode 165 electrically connected to a respective one of the first access lines (e.g., to one of the word lines 30 controlled by the row decoder 560), a first active region 162 (which may be one of a source region and a drain region) electrically connected to a respective one of the second access lines (e.g., to one of the access lines 40 controlled by the access line decoder 520), and a second active region 168 (which may be another of the source region and the drain region) connected to a first end portion of a respective one of the discrete metallic assist plates 200. Thus, the first end portion of each of the discrete metallic assist plates 200 is electrically connected to a respective second active region 168 of the two-dimensional array of transistors 160, and the opposite second end portion of each of the discrete metallic assist plates 200 is electrically connected to a common node having a same electrical potential, such as to electrical ground.

A two-dimensional array of transistors 160 can be manufactured on a substrate employing methods known in the art, and the first access lines and the second access lines can be formed as metal interconnect structures overlying or underlying the field effect transistors and embedded in metal-interconnect-level dielectric material layers. As noted above, in an alternative embodiment, the array 300 may be turned up-side down to form the SOT MRAM cells 180 in a bottom-pinned configuration.

FIG. 2B illustrates a write operation on a selected SOT MRAM cell 180. In this case, a programming current $I_{WR}$ flows through the discrete metallic assist plate 200 located adjacent to the free layer 136 of a respective SOT MRAM cell 180. A programming voltage $V_{write}$ can be applied to the first active region 162 of the transistor 160 electrically connected to the selected SOT MRAM cell 180 by the access line decoder 520 through a respective access line 40, and a gate turn-on voltage can be applied to the gate electrode 165 of the transistor 160 electrically connected to the selected SOT MRAM cell 180 by the row decoder 520 through a respective word line 40. The transistor 160 connected to the selected SOT MRAM cell 180 is turned on to provide the programming current $I_{WR}$.

FIG. 2C illustrates a read operation on a selected SOT MRAM cell 180. The transistor 160 connected to the selected SOT MRAM cell 180 is turned on with a read voltage $V_{read}$ which is lower than the write voltage $V_{write}$ (such as $V_{read} = \alpha \times V_{write}$ in which $\alpha$ is in a range from 0.1 to 0.9) at the first active region 162, and the read line 100 connected to the selected SOT MRAM cell 180 is biased at a voltage that is the negative of the complement of the read voltage $V_{read}$. For example if a read voltage $V_{read}$ of 0.5V is applied to the first active region, then −0.5V can be applied to the read line 100 by the column decoder 580 and the sense amplifier circuitry 570. The read voltage $V_{read}$ is greater than the threshold voltage $V_{threshold}$ of the first selector elements 120, which is the minimum voltage across a first selector element 120 that is needed to turn on the first selector element 120. The read current $I_{RD}$ flows through the MTJ 130 of a SOT MRAM cell 180 being read between its discrete metallic assist plate 200 and its read line 100.

Figure 3:
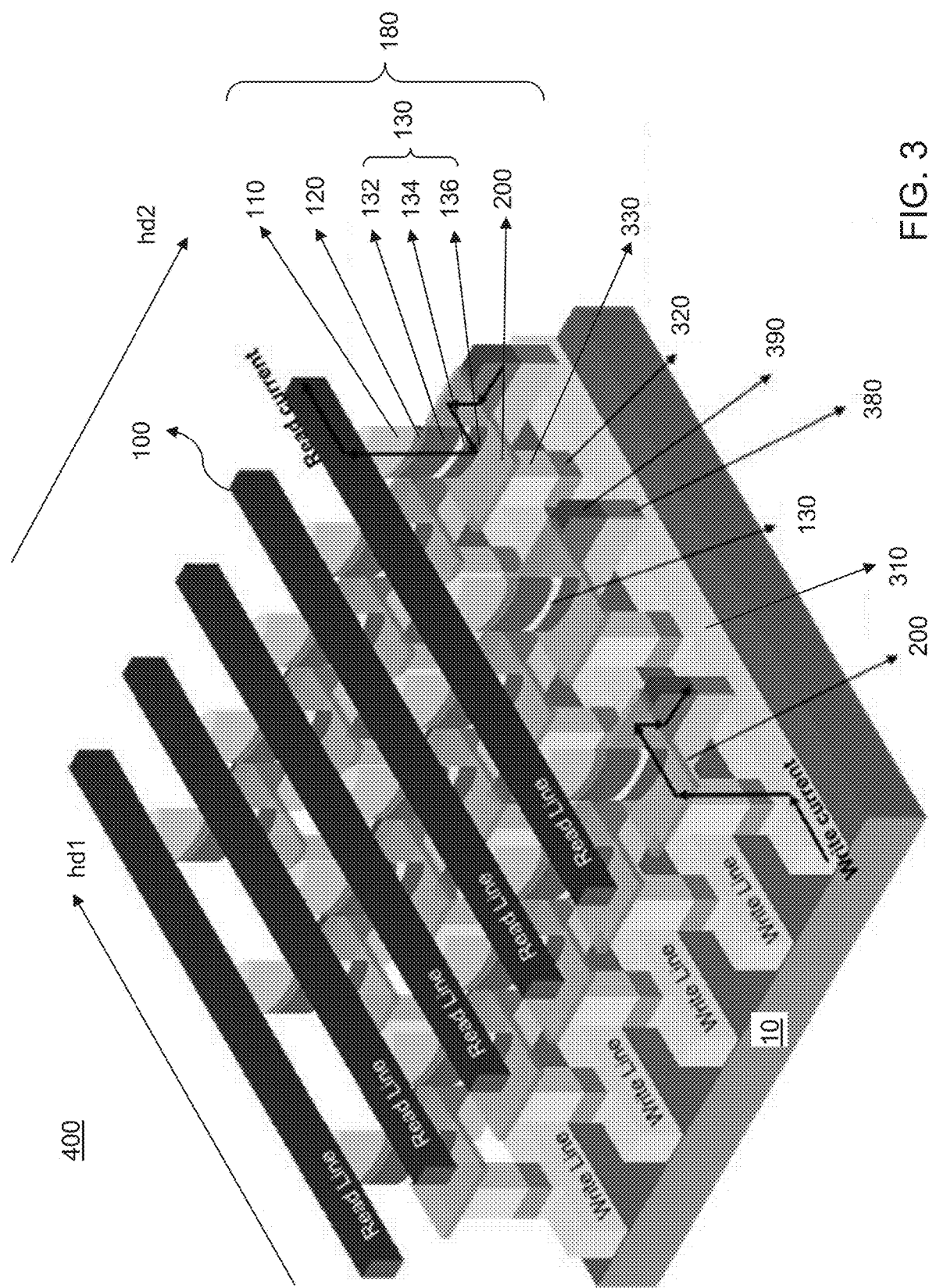
FIG. 3 illustrates a perspective view of an array region of a second exemplary spin-orbit-torque (SOT) magnetoresistive memory array of the present disclosure.

Referring to FIG. 3, a second exemplary spin-orbit-torque (SOT) magnetoresistive memory array 400 of a second embodiment of the present disclosure is illustrated, which can be derived from the first exemplary SOT magnetoresistive memory array of FIGS. 2A-2C by employing a second selector element 320 for each SOT MRAM cell 180 instead of the transistor 160. The second selector elements 320 are also referred to as lower selector elements if the MRAM cell 180 is in the top-pinned configuration. If the SOT MRAM cell 180 is in the bottom-pinned configuration, then the cell is turned upside down and the second selector elements 320 become the upper selector elements. The second selector elements 320 can include a second diode or a second ovonic threshold switch material, and can have a higher threshold voltage than the first selector elements 120. Programming (write) operations can be performed by turning on a respective second selector element 320 which is electrically connected to a respective discrete metallic assist plate (i.e., SOT layer) 200, and read (sense) operations can be performed by turning on a respective first selector element 120 electrically connected to the respective read line 100.

First access lines 310 and second access lines 390 laterally extending along mutually perpendicular directions are provided. For example, the first access lines 310 may comprise write lines (e.g., word lines 30 shown in FIG. 1B or lines which are electrically connected to the word lines 30 shown in FIG. 1B) which laterally extend along the first horizontal direction hd1, and the second access lines 390 may comprise ground lines which laterally extend along the second horizontal direction hd2. The first access lines 310 and the second access lines 390 can be configured to activate electrical current flow through a selected one of the discrete metallic assist plates 200 by activating a respective second selector element 320 which comprises the circuit selection element in this embodiment.

In one embodiment, a first end portion of each of the discrete metallic assist plates 200 is electrically connected to a respective one of the first access lines 310 through a respective one of the second selector elements 320, and a second end portion of each of the discrete metallic assist plates 200 is electrically connected to a respective one of the second access lines 390. In one embodiment, the first end portion and the second end portion of each of the discrete metallic assist plates 200 can be laterally spaced apart along the first horizontal direction hd1, and each of the second access lines 390 laterally extends along the second horizontal direction hd2. The second horizontal direction hd2 can be perpendicular to the first horizontal direction hd1. Each of the second access lines 390 can contact bottom surfaces of second end portions of a respective column of discrete metallic assist plates 200 that are arranged along the second horizontal direction hd2. Each of the second access lines 390 can also be connected to the electrical ground.

In one embodiment, each first end portion of the discrete metallic assist plates 200 is connected to an underlying one of the first access lines 310 by a rectangular pillar (320, 330) including a stack of a respective one of the second selector elements 320 and a respective metal pillar structure (e.g., metal electrode) 330. The rectangular pillar has a same width along the second horizontal direction hd2 as the underlying one of the first access lines 310 as will be described in more detail below.

In one embodiment, each second access line 390 that is located between neighboring columns of rectangular pillars (320, 330) is laterally equidistant from the neighboring columns of rectangular pillars (320, 330). In this case, the second access lines 390 can be formed by a self-alignment method that is described below. In one embodiment, the first access lines 310 extend along the first horizontal direction hd1 and underlies the second access lines 390, and a row of second selector elements 320 is located between each one of the first access lines 310 and first end portions of a respective overlying row of discrete metallic assist plates 200 that are arranged along the first horizontal direction hd1. An insulating liner 380 is located between each one of the second access lines 390 and the underlying first access lines 310.

In one embodiment, a vertical spacing between the second access lines 390 and the first access lines 310 (i.e., the height of the insulating spacer 380) is the same as a lateral spacing between one of the second access lines 390 and respective neighboring columns of rectangular pillars (320, 330).

FIGS. 4-12 are perspective views illustrating a sequence of processing steps that can be employed to form the second exemplary SOT magnetoresistive memory array 400 of the second embodiment of the present disclosure.

Referring to FIG. 4, a layer stack including a first metal layer 310L, a lower selector material layer 320L, and a second metal layer 330L can be deposited over a substrate 10 including an insulating top surface. The insulating top surface may be provided, for example, by forming semiconductor devices (such as field effect transistors for the various circuitry illustrated in FIG. 1B) on a semiconductor substrate, and by forming at least one insulating layer thereupon. Metal interconnect structures may be embedded within the at least one insulating layer. The metal interconnect structures may be configured to provide electrical contact to the first access lines 310 and the second access lines 390 to be subsequently formed. Alternatively, an insulating substrate may be used instead and the circuitry illustrated in FIG. 1B may be formed on the side of the array 400 instead of below the array 400.

The first metal layer 310L includes at least one metallic material to be patterned into first access lines 310. The lower selector material layer 320L includes a second ovonic threshold switch material or a second diode material to be subsequently patterned into a two-dimensional array of second selector elements 320. The second metal layer 330L includes at least one metallic material to be subsequently patterned into a two-dimensional array of metal pillar structures 330.

Referring to FIG. 5, a first photoresist layer 337 is applied over the second metal layer 330L, and is lithographically patterned to form a line and space pattern that extends along the first horizontal direction hd1 and alternates along the second horizontal direction hd2. The line and space pattern may be a periodic pattern having a uniform pitch along the second horizontal direction hd2, which is herein referred to as a second pitch.

Referring to FIG. 6, an anisotropic etch is performed to transfer the line and space pattern of the first photoresist layer 337 through the stack of the second metal layer 330L, the lower selector material layer 320L, and the first metal layer 310L. Remaining portions of the first metal layer 310L include first access lines 310 that laterally extend along the first horizontal direction hd1 and have a uniform width along the second horizontal direction hd2. Remaining portions of the lower selector material layer 320L include selector material rails 320R that laterally extend along the first horizontal direction hd1 and have the uniform width along the second horizontal direction hd2. Remaining portions of the second metal layer 330L include metal rails 330R that laterally extend along the first horizontal direction hd1 and have the uniform width along the second horizontal direction hd2. The first photoresist layer 337 can be removed, for example, by ashing.

Referring to FIG. 7, a dielectric matrix material layer 340 can be formed by depositing a dielectric material such as silicon oxide, and by planarizing the top surface of the dielectric material. For example, chemical mechanical planarization (CMP) may be employed to planarize the dielectric matrix material layer 340. The planarized top surface of the dielectric matrix material layer 340 can be coplanar with the top surfaces of the metal rails 330R. The dielectric matrix material layer 340 can include a plurality of dielectric rails that laterally extend along the first horizontal direction hd1 and has a respective uniform vertical cross-sectional shape along vertical planes that are perpendicular to the first horizontal direction hd1.

Referring to FIG. 8, a second photoresist layer 347 is applied over the metal rails 330R and the dielectric matrix material layer 340, and is lithographically patterned with a line and space pattern that extends along the second horizontal direction hd2 alternates along the first horizontal direction hd1.

Referring to FIG. 9, an anisotropic etch process can be performed to transfer the pattern of the second photoresist layer 347 through the dielectric matrix material layer 340, the metal rails 330R, and the selector material rails 320R. Each remaining patterned portion of the metal rails 330R constitutes a metal pillar structure 330. Each remaining patterned portion of the selector material rails 320R constitutes a second selector element 320. Each contiguous set of a metal pillar structure 330 and a second selector element 320 constitutes a rectangular pillar (320, 330) having a rectangular horizontal cross-sectional area. Thus, the first access lines 310 extending along the first horizontal direction and an overlying two-dimensional array of rectangular pillars (320, 330) can be provided.

Each of the rectangular pillars (320, 330) includes a stack of a respective one of the second selector elements 320 (which can be diodes or ovonic threshold switch material portions) and a respective metal pillar structure 330. The ovonic threshold switch material portions are herein referred to as lower ovonic threshold switch material portions or second ovonic threshold switch material portions. The metal pillar structures 330 include top surfaces, which are a two-dimensional array of conductive surface portions. The two-dimensional array of conducive surface portions of the metal pillar structures 330 are herein referred to as a first subset of the conductive surface portions in contrast to a second subset of conductive surface portions to be subsequently formed.

The remaining portions of the dielectric matrix material layer 340 include dielectric strips including periodic castellations, i.e., a periodic arrangement of protruding portions. The castellations of the dielectric strips of the dielectric matrix material layer 340 can have the same periodicity along the first horizontal direction hd1 as the rectangular pillars (320, 330). Each rectangular pillar (320, 330) can have a same width along the second horizontal direction hd2 as an underlying first access line 310. Line trenches laterally extending along the second horizontal direction hd2 can be formed between neighboring columns of the rectangular pillars (320, 330) that are arranged along the second horizontal direction hd2. Each line trench is located between two columns of castellations of multiple strips of the dielectric matrix material layer 340.

Referring to FIG. 10, an insulating layer 380L is deposited in the line trenches and over the castellations of the dielectric matrix material layer 340 and the two-dimensional array of rectangular pillars (320, 330). The insulating layer 380L includes an insulating material such as silicon oxide. The thickness of the insulating layer 380L is selected to be less than one half of the width of each line trench, and is less than the depth of each line trench.

Referring to FIG. 11, at least one metallic material is deposited in remaining volumes of the line trenches. The thickness of the at least one metallic material is selected such that the remaining volumes of the line trenches are filled with the at least one metallic material. The at least one metallic material can include, for example, a metallic nitride liner material (such as TiN, TaN, or WN) and a metal fill material (such as W, Cu, Al, Co, Ru, Mo, etc.).

Referring to FIG. 11, portions of the at least one metallic material and the insulating layer 380L that overlie the horizontal plane including the top surfaces of the metal pillar structures 330 can be removed by a planarization process, which can employ chemical mechanical planarization and/or at least one recess etch process. Each remaining portion of the at least one metallic material constitutes a second access line 390. Each remaining portion of the insulating layer 380L constitutes an insulating liner 380. Each insulating liner 380 fills a bottom portion and a peripheral portion of a respective line trench, and a second access line 390 is formed in a remaining volume of the respective line trench. Top surfaces of the second access lines 390 include a second subset of the conductive surface portions, on which second end portions of the discrete metallic assist plates 200 are subsequently formed.

The first access lines 310 and the second access lines 390 laterally extend along mutually perpendicular directions over the substrate 10. A two-dimensional array of circuit selection elements such as the second selector elements 320 can be connected to the first access lines 310. The two-dimensional array of circuit selection elements can include second ovonic threshold switch material portions.

Generally, the two-dimensional array of circuit selection elements is configured to electrically connect a selected one of the first access lines 310 and a selected one of the second access lines 390 to a selected conductive surface portion or a selected pair of conducive surface portions. In the structure illustrated in FIG. 12, the two-dimensional array of second selector elements 320 is configured to electrically connect each of the first access lines 310 to a respective metal pillar structure 330.

If transistors 160 of the first embodiment are used as the circuit selection elements, then the two-dimensional array of circuit selection elements can be configured to electrically connect a selected one of the first access lines 310 to a respective electrode or via structure that is electrically connected to a second active region 168 of a respective transistor 160.

In one embodiment, each first end portion of the discrete metallic assist plates 200 is connected to an underlying one of the first access lines 310 by a rectangular pillar (320, 330) including a stack of a respective one of the second selector elements 320 and a respective metal pillar structure 330. The rectangular pillar (320, 330) has a same width along the second horizontal direction hd2 as the underlying one of the first access lines 310. In one embodiment, each second access line 390 that is located between neighboring columns of rectangular pillars (320, 330) is laterally equidistant from the neighboring columns of rectangular pillars (320, 330) because the insulating liners 380 have a same lateral thickness on both sides of the second access line 390. Further, the lateral thickness of vertically extending portions of the insulating liners 380 can be the same as the vertical thickness of bottom portions of the insulating liners 380. In this case, a vertical spacing between the second access lines 390 and the first access lines 310 can be the same as a lateral spacing between one of the second access lines 390 and respective neighboring columns of rectangular pillars (320, 330).

FIGS. 13-21 are perspective views illustrating a sequence of processing steps that can be employed to form the first exemplary SOT magnetoresistive memory array 300 or the second exemplary SOT magnetoresistive memory array 400 of the first and second embodiments of the present disclosure.

Referring to FIG. 13, a metallic material layer 200L, a first magnetic material layer 136L, a nonmagnetic barrier material layer 134L, a synthetic antiferromagnet material layer stack 132L, an upper selector material layer 120L, and a metallic capping material layer 110L can be sequentially deposited as blanket layers (i.e., unpatterned layers). The metallic material layer 200L includes the material of, and has the same thickness as, the discrete metallic assist plates 200 described above. The first magnetic material layer 136L includes the material of, and has the same thickness as, the free layer 136 described above. The nonmagnetic barrier material layer 134L includes the material of, and has the same thickness as, the nonmagnetic barrier layer (i.e., tunneling dielectric layer) 134 described above. The synthetic antiferromagnet material layer stack 132L includes the material stack of the SAF structure 132 described above. The upper selector material layer 120L includes the material of, and has the same thickness as, the first selector element 120 described above. The metallic capping material layer 110L includes the material of, and has the same thickness as, the metallic capping material portion 110 described above.

Referring to FIG. 14, a protective layer 107 can be applied over the metallic capping material layer 110L, and can be patterned to cover a two-dimensional array of discrete areas. This patterning could be achieved with photolithography, nanoimprint lithography, or another suitable method. The protective layer 107 could be photoresist, or some etch mask that has created from the original patterning material via some image transfer process. Each discrete area can be located between a respective neighboring pair of a rectangular pillar (320, 330) and an adjacent second access line 390 in a plan view, i.e., in a top-down view. In one embodiment, each discrete area can be located midway between a respective neighboring pair of a rectangular pillar (320, 330) and an adjacent second access line 390 in a plan view Referring to FIG. 15, an anisotropic etch process is performed to transfer the pattern in the photoresist layer 117 through the layer stack including the first magnetic material layer 136L, the nonmagnetic barrier material layer 134L, the synthetic antiferromagnet material layer stack 132L, the upper selector material layer 120L, and the metallic capping material layer 110L. The metallic material layer 200L can be employed as an etch stop layer. A two-dimensional array of SOT MRAM cells 180 is formed. The photoresist layer 107 can be subsequently removed, for example, by ashing. The two-dimensional array of SOT MRAM cells 180 can have the same two-dimensional periodicity as the rectangular pillars (320, 330) located underneath.

Figures 16, 17, 18:
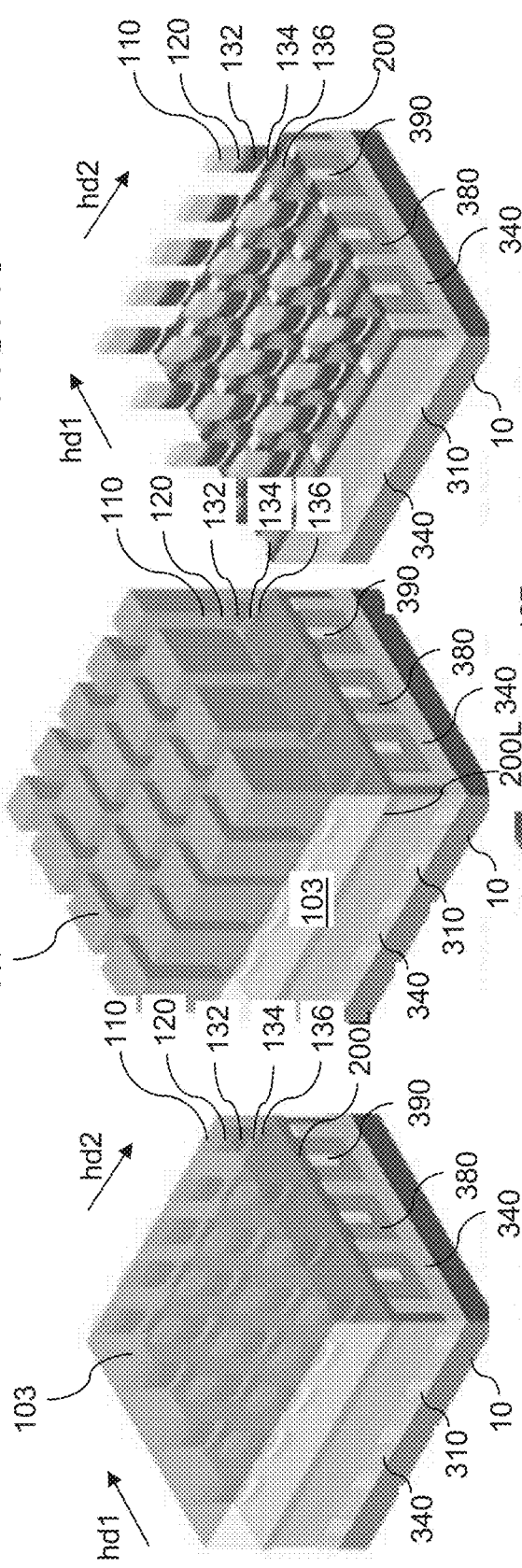

Referring to FIG. 16, a sacrificial matrix material layer 103 can be applied over the two-dimensional array of SOT MRAM cells 180, and can be planarized to provide a planar surface. The sacrificial matrix material layer 103 may be a polymer material, a carbon-based material (such as amorphous carbon), or a spin-on-glass. The sacrificial matrix material layer 103 may be a self-planarizing material, or may be planarized by chemical mechanical planarization.

Referring to FIG. 17, a photoresist layer 117 can be applied over the sacrificial matrix material layer 103, and can be lithographically patterned to form a two-dimensional array of discrete polygons or a discrete curvilinear shape. In one embodiment, the two-dimensional array of discrete polygons or a discrete curvilinear shape can be a two-dimensional array of rectangles having the same periodicity as the two-dimensional array of SOT MRAM cells 180. In one embodiment, the two-dimensional array of SOT MRAM cells 180 can be entirely covered by the patterned portions of the photoresist layer 117.

Referring to FIG. 18, an anisotropic etch process can be performed to transfer the pattern of the photoresist layer 117 through the sacrificial matrix material layer 103 and through the metallic material layer 200L. The metallic material layer 200L is patterned into a two-dimensional array of discrete metallic material plates that are employed to assist magnetic transition in the free layers through the spin Hall effect. As such, the discrete metallic material plates are herein referred to as discrete metallic assist plates 200. The photoresist layer 117 can be subsequently removed, for example, by ashing. Remaining portions of the sacrificial matrix material layer 103 can be removed by a solvent or by ashing.

The two-dimensional array of discrete metallic assist plates 200 can be formed such that a first end portion of each of the discrete metallic assist plates 200 contacts a top surface of a respective conductive surface portion within a first two-dimensional array of conductive surface portions, and a second end portion of each of the discrete metallic assist plates 200 contacts a top surface of a respective conductive surface portion within a second two-dimensional array of conducive surface portions. The first two-dimensional array of conductive surface portions can include top surfaces of the metal pillar structures 330, and the second two-dimensional array of conductive surface portions can include surface portions of the second access lines 390 that has an areal overlap with the first access lines 310.

Each of the SOT MRAM cells 180 comprises a vertical stack including, from top to bottom, a first selector element 120, a fixed magnetization (i.e., reference) layer 122 having a fixed magnetization direction, a tunneling dielectric layer 134, free layer 136 configured to have a magnetization direction that is parallel or antiparallel to the fixed magnetization direction and discrete metallic assist plate 200. The first selector elements 120 can comprise first ovonic threshold switch material portions or first diodes. In one embodiment, the first access lines 310 extend along the first horizontal direction hd1 and underlies the second access lines 390, and a row of second selector elements 320 is located between each one of the first access lines 310 and first end portions of a respective overlying row of discrete metallic assist plates 200.

Figures 19, 20, 21:
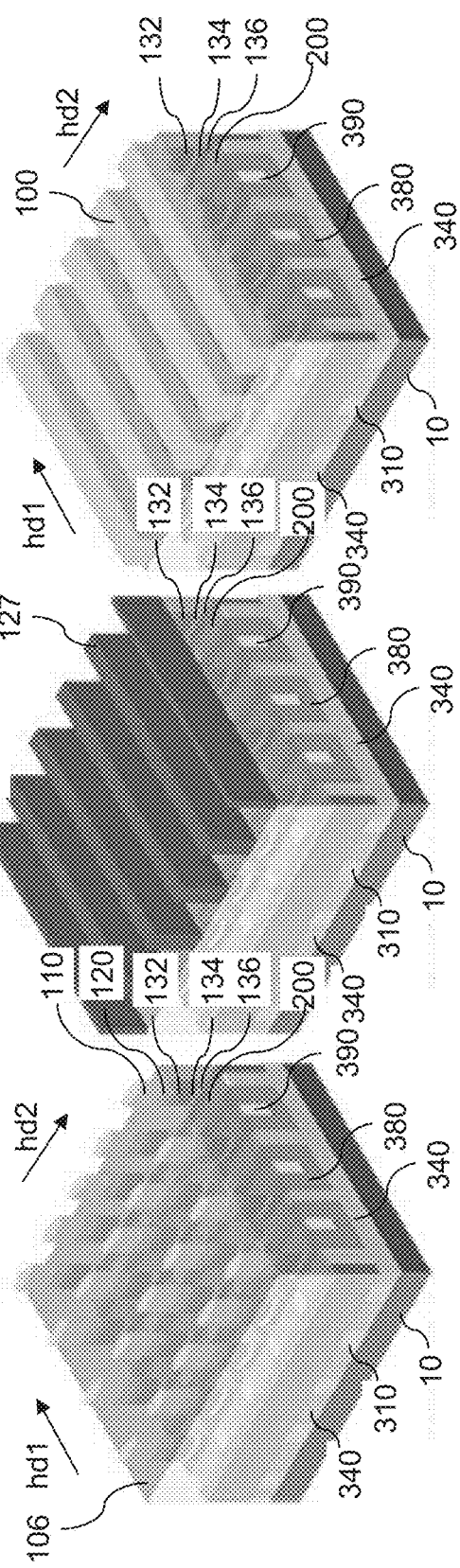

Referring to FIG. 19, a dielectric material layer 106 can be deposited and can be planarized to provide a top surface that is coplanar with the top surfaces of the metallic capping material portions 110.

Referring to FIG. 20, a photoresist layer 127 can be deposited over the two-dimensional array of SOT MRAM cells 180, and can be lithographically patterned to form line trenches in which top surfaces of a respective row SOT MRAM cells 180 are physically exposed.

Referring to FIG. 21, a metallic material can be selectively deposited in the line trenches. The photoresist layer 127 and portions of the deposited metallic material overlying the photoresist layer 127 can be lifted off. The read lines 100 are formed by lift-off over the two-dimensional array of SOT MRAM cells 180. Each of the read lines 100 is electrically connected to upper ends of a respective subset of the first selector elements 120 located within a respective row of the SOT MRAM cells 180. Alternatively, a metallic material may be blanked deposited over the SOT MRAM cells and then photolithographically patterned to form the read lines 100

A unit memory cell 180 of the embodiments of the present disclosure includes a first two terminal selector element 120 and a single transistor 160, or a combination of a first two terminal selector element 120 and a second two terminal selector element 320. Traditional SOT MRAM cells require two select transistors per SOT MRAM cell. Thus, the devices of the embodiments of the present disclosure can achieve a higher device density. Furthermore, by forming the first selector element 120 during the same patterning steps as the MTJ 130, complex transistor formation and its electrical connection to MTJ 130 are avoided. Still further, the one embodiment of the present disclosure provides second access lines 390 that are self-aligned to rectangular pillars (320, 330), thereby reducing the number of lithographic steps needed to pattern the device structure. If a large overdrive current is used, then only a single large transistor of the first embodiment may be included per memory cell which reduces the device density compared to two large transistors per memory cell.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A spin-orbit-torque (SOT) magnetoresistive random access memory (MRAM) device comprising:
   a SOT MRAM cell comprising a first two terminal selector element, a nonmagnetic metallic assist plate comprising a SOT metal layer, and a magnetic tunnel junction located between the first two terminal selector element and the nonmagnetic metallic assist plate; and
   a circuit selection element comprising a transistor electrically connected to the nonmagnetic metallic assist plate of the SOT MRAM cell,
   wherein the first two terminal selector element and the circuit selection element are spaced from each other by a combination of the magnetic tunnel junction and the nonmagnetic metallic assist plate.

2. The SOT MRAM cell of claim 1, wherein the transistor is located below the nonmagnetic metallic assist plate.

\* \* \* \* \*